United States Patent
Landru et al.

(10) Patent No.: US 12,142,517 B2
(45) Date of Patent: Nov. 12, 2024

(54) METHOD FOR TRANSFERRING A USEFUL LAYER FROM A DONOR SUBSTRATE ONTO A SUPPORT SUBSTRATE BY APPLYING A PREDETERMINED STRESS

(71) Applicant: Soitec, Bernin (FR)

(72) Inventors: Didier Landru, Le Champ-près-Froges (FR); Oleg Kononchuk, Theys (FR); Nadia Ben Mohamed, Echirolles (FR)

(73) Assignee: Soitec, Bernin (FR)

( * ) Notice: Subject to any disclaimer, the term of this patent is extended or adjusted under 35 U.S.C. 154(b) by 411 days.

(21) Appl. No.: 17/436,532

(22) PCT Filed: Feb. 26, 2020

(86) PCT No.: PCT/FR2020/050367
§ 371 (c)(1),
(2) Date: Sep. 3, 2021

(87) PCT Pub. No.: WO2020/188167
PCT Pub. Date: Sep. 24, 2020

(65) Prior Publication Data
US 2022/0172983 A1 Jun. 2, 2022

(30) Foreign Application Priority Data
Mar. 15, 2019 (FR) .................................... 1902668

(51) Int. Cl.
*H01L 21/762* (2006.01)
(52) U.S. Cl.
CPC ............................. *H01L 21/76254* (2013.01)
(58) Field of Classification Search
CPC ................................................ H01L 21/76254
See application file for complete search history.

(56) References Cited

U.S. PATENT DOCUMENTS

| 9,914,233 | B2 | 3/2018 | Landru | |
|---|---|---|---|---|
| 2013/0062020 | A1* | 3/2013 | Ries | H01L 21/67092 156/760 |
| 2015/0303098 | A1* | 10/2015 | Landru | H01L 21/6835 438/458 |
| 2015/0375495 | A1* | 12/2015 | Young | H01L 21/67092 156/714 |

(Continued)

FOREIGN PATENT DOCUMENTS

| EP | 2802001 A1 | 11/2014 |
|---|---|---|
| EP | 2933828 B1 | 10/2016 |

(Continued)

OTHER PUBLICATIONS

French Opinion for French Application No. 1902668 dated Sep. 4, 2019, 4 pages.

(Continued)

*Primary Examiner* — Thao X Le
*Assistant Examiner* — Sean Ayers Winters
(74) *Attorney, Agent, or Firm* — TraskBritt

(57) ABSTRACT

A method for transferring a useful layer from a donor substrate to a carrier substrate comprises: a) providing the donor substrate, the donor substrate including a buried weakened plane; b) providing the carrier substrate; c) joining the donor substrate to the carrier substrate to form a bonded structure; and d) annealing the bonded structure in order to increase the level of weakening of the buried weakened plane. A predetermined stress is applied to the buried weakened plane during the annealing for a period of time, the predetermined stress being selected so as to initiate the splitting wave once a given level of weakening has been reached. At the end of the period of time, the given level of weakening having been reached, the predetermined stress causes initiation and self-sustained propagation of the splitting wave along the buried weakened plane, resulting in the useful layer being transferred to the carrier substrate.

20 Claims, 3 Drawing Sheets

(56) References Cited

U.S. PATENT DOCUMENTS

2018/0166622 A1* 6/2018 Akiyama .............. H01L 21/425
2019/0080957 A1* 3/2019 Peidous ................ H01L 29/045

FOREIGN PATENT DOCUMENTS

| JP | 2010-514185 | A  | 4/2010 |
|----|-------------|----|--------|
| JP | 2012-186292 | A  | 9/2012 |
| JP | 2014-515171 | A  | 12/2014 |
| JP | 2015-213161 | A  | 11/2015 |
| WO | 2005/043615 | A1 | 3/2005 |
| WO | 2005/043616 | A1 | 3/2005 |

OTHER PUBLICATIONS

French Search Report for French Application No. 1902668 dated Sep. 4, 2019, 2 pages.
International Search Report for International Application No. PCT/FR2020/050367 dated Jun. 26, 2020, 2 pages.
International Written Opinion for International Application No. PCT/FR2020/050367 dated Jun. 26, 2020, 6 pages.
Massy et al., Fracture Dynamics in Implanted Silicon, Applied Physics Letters, vol. 107, (2015), 7 pages.
Singapore Written Opinion for Application No. 11202109798U dated Jun. 9, 2023, 8 pages.
Taiwanese Office Action and Search Report for Application No. 11220195480 dated Feb. 24, 2023, 16 pages with machine translation.
Japanese Notice of Reasons for Rejection for Application No. 2021-555272 dated Jan. 30, 2023, 3 pages.
Singapore Written Opinion for Application No. 11202109798U dated Apr. 8, 2024, 5 pages.
Japanese Notice of Reasons for Rejection for Application No. 2021-555272 dated Jun. 18, 2024, 2 pages.

* cited by examiner

FIG. 1: Prior art

METHOD FOR TRANSFERRING A USEFUL LAYER FROM A DONOR SUBSTRATE ONTO A SUPPORT SUBSTRATE BY APPLYING A PREDETERMINED STRESS

CROSS-REFERENCE TO RELATED APPLICATIONS

This application is a national phase entry under 35 U.S.C. § 371 of International Patent Application PCT/FR2020/050367, filed Feb. 26, 2020, designating the United States of America and published as International Patent Publication WO 2020/188167 A1 on Sep. 24, 2020, which claims the benefit under Article 8 of the Patent Cooperation Treaty to French Patent Application Serial No. 1902668, filed Mar. 15, 2019.

TECHNICAL FIELD

The present disclosure relates to the field of microelectronics. In particular, the present disclosure relates to a process for transferring a useful layer to a carrier substrate.

BACKGROUND

A process for transferring a useful layer 3 to a carrier substrate 4, shown in FIG. 1, is known from the prior art; this process, described, in particular, in documents WO2005043615 and WO2005043616, comprises the following steps:
- forming a buried weakened plane 2 by implanting light species into a donor substrate 1 so as to form a useful layer 3 between this plane and a surface of the donor substrate;
- next, joining the donor substrate 1 to a carrier substrate 4 to form a bonded structure 5;
- applying a heat treatment to the bonded structure 5 in order to weaken the buried weakened plane;
- and lastly, initiating a splitting wave by means of an energy pulse applied at the level of the buried weakened plane 2, with self-sustained propagation of the splitting wave in the donor substrate 1 along the buried weakened plane 2.

In this process, the species implanted at the level of the buried weakened layer 2 initiate the development of microcavities. The weakening heat treatment has the effect of promoting the growth and pressurization of these microcavities. By applying additional outside forces (energy pulse) after the heat treatment, a splitting wave is initiated in the buried weakened plane 2, which wave propagates in a self-sustained manner, resulting in the useful layer 3 being transferred through detachment at the level of the buried weakened plane 2. Such a process makes it possible, in particular, to decrease the roughness of the surface after transfer.

This process may be used to produce silicon-on-insulator (SOI) substrates. In this case, the donor substrate 1 and the carrier substrate 4 are each formed of a silicon wafer, the standard diameter of which is typically 200 mm, 300 mm or 450 mm for later generations. Either or both of the donor substrate 1 and the carrier substrate 4 are surface-oxidized.

SOI substrates must comply with very stringent specifications. This is particularly the case for the average thickness and the uniformity of thickness of the useful layer 3. Complying with these specifications is necessary for the semiconductor devices that will be formed in and on this useful layer 3 to operate correctly.

In some cases, the architecture of these semiconductor devices requires arranging SOI substrates exhibiting very low average thickness of the useful layer 3, for example, lower than 50 nm, and exhibiting very high uniformity of thickness for the useful layer 3. The expected uniformity of thickness may be about 5% at most, corresponding to variations typically from +/−0.3 nm to +/−1 nm over the entire surface of the useful layer 3. Even if additional finishing steps, such as etches or surface-smoothing heat treatments, are carried out after the useful layer 3 has been transferred to the carrier substrate 4, it is important for the morphological surface properties to be as favorable as possible after transfer in order to ensure that the end specifications are met.

It has been observed that the useful layers 3 transferred according to the aforementioned process, resulting from bonded structures prepared under similar conditions and having undergone the same weakening heat treatment, do not exhibit morphological surface properties (roughness, uniformity of thickness) that are reproducible from one wafer to the next. The non-reproducibility of the morphological surface properties of the useful layers after transfer may affect production yields because finishing steps are not always successful in bringing the roughness and uniformity of thickness of all of the useful layers to the required specification level.

BRIEF SUMMARY

The present disclosure relates to a process for transferring a useful layer to a carrier substrate. The process aims to obtain a low degree of surface roughness and a high degree of uniformity of thickness for the useful layers after transfer and to improve the wafer-to-wafer reproducibility of the morphological surface properties of the transferred useful layers.

The present disclosure relates to a process for transferring a useful layer to a carrier substrate, comprising the following steps:
 a) providing a donor substrate including a buried weakened plane, the useful layer being delimited by a front face of the donor substrate and the buried weakened plane;
 b) providing a carrier substrate;
 c) joining the donor substrate, by its front face, to the carrier substrate along a bonding interface so as to form a bonded structure; and
 d) annealing the bonded structure in order to increase the level of weakening of the buried weakened plane.

The transfer process is noteworthy in that:
 a predetermined stress is applied to the buried weakened plane in annealing step d) for a period of time, the predetermined stress being chosen so as to initiate the splitting wave once a given level of weakening has been reached;
 at the end of the period of time, the given level of weakening having been reached, the predetermined stress causes the initiation and the self-sustained propagation of the splitting wave along the buried weakened plane, resulting in the useful layer being transferred to the carrier substrate.

According to other advantageous and non-limiting features of the present disclosure, taken alone or in any technically feasible combinations:
 the period of time is between one minute and five hours;
 the period of time is a fraction of the duration of the anneal between 1% and 100%;

the transfer process is applied to the batch treatment of a plurality of bonded structures, and the predetermined stress is applied to the buried weakened plane of each of the bonded structures so as to initiate the splitting wave once the given level of weakening has been reached for each bonded structure;

the anneal in step d) is performed in a horizontally or vertically configured heat treatment apparatus, suitable for batch-treating a plurality of bonded structures;

the predetermined stress is applied locally to the buried weakened plane of the bonded structure by means of a wedge that is positioned at the bonding interface and exerts a pressing force against the chamfered edges of the donor and carrier substrates of the bonded structure so as to generate a tensile strain in the buried weakened plane;

the pressing force is between 0.5 N and 50 N;

the given level of weakening is defined by the area occupied by microcavities in the buried weakened plane and is chosen to be between 1% and 90%, preferably, between 5% and 40%;

the anneal in step d) reaches a maximum temperature between 300° C. and 600° C.;

the predetermined stress is applied from the start of the anneal in step d); and the donor substrate and the carrier substrate are made of monocrystalline silicon, and wherein the buried weakened plane is formed by ion implantation of light species into the donor substrate, the light species being chosen from hydrogen and helium, or a combination of hydrogen and helium.

BRIEF DESCRIPTION OF THE DRAWINGS

Other features and advantages of the present disclosure will become apparent from the following detailed description of embodiments of the present disclosure, which description is given with reference to the accompanying figures, in which.

DETAILED DESCRIPTION

Figure 1:
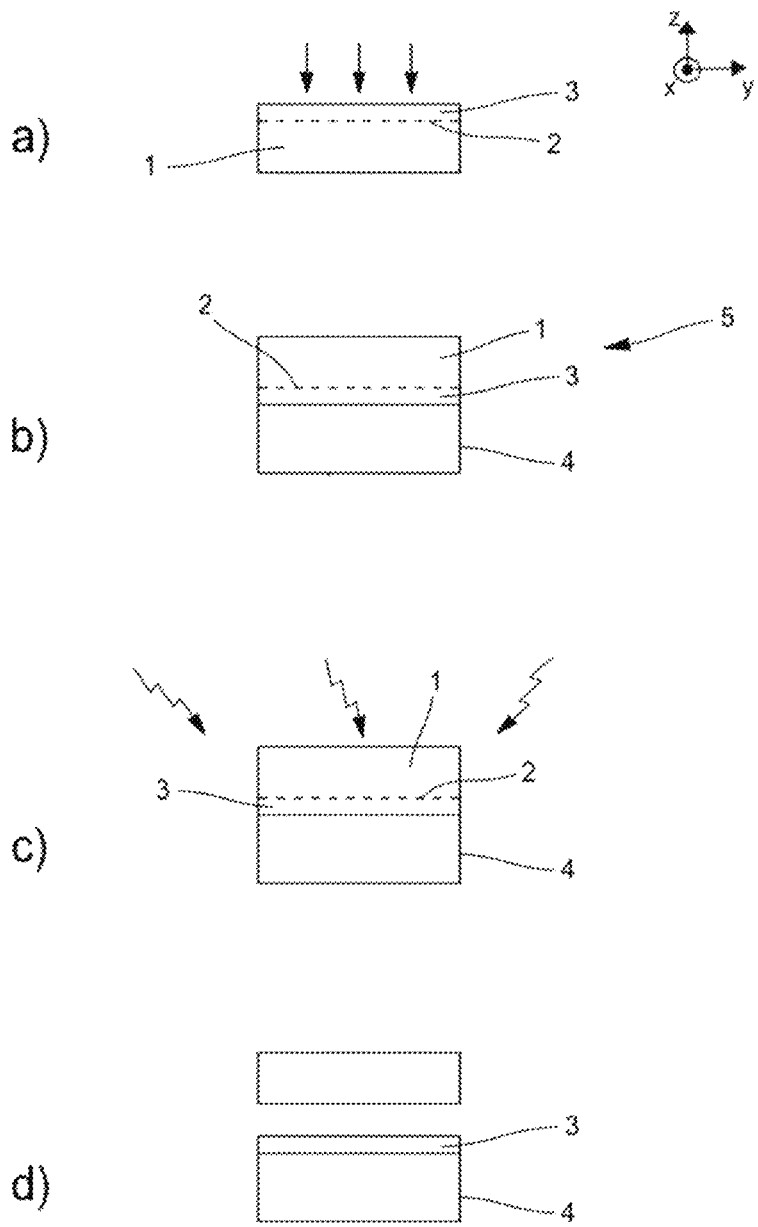
FIG. 1 shows a process for transferring a thin layer according to the prior art.
Figure 2:
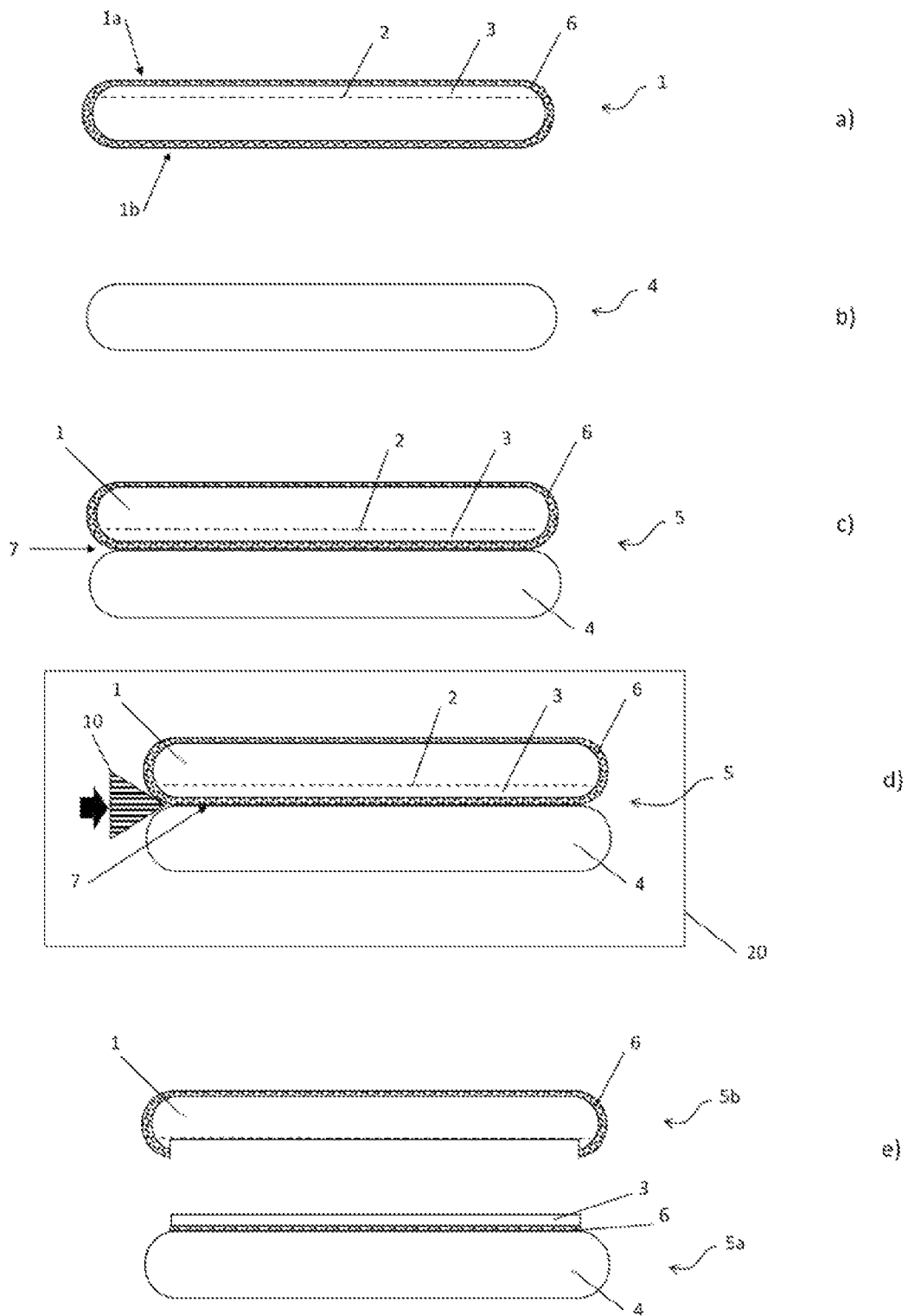
FIG. 2 shows a transfer process according to the present disclosure.

In the description, the same reference signs in the figures might be used for elements of the same type. The figures are schematic representations that, for the sake of legibility, are not to scale. In particular, the thicknesses of the layers along the z-axis are not to scale with respect to the lateral dimensions along the x- and y-axes; and the relative thicknesses of the layers with respect to one another are not necessarily respected in the figures. It should be noted that the coordinate system (x,y,z) of FIG. 1 applies to FIG. 2.

The present disclosure relates to a process for transferring a useful layer 3 to a carrier substrate 4. The useful layer 3 is named as such because it is intended for use in the production of components in the fields of microelectronics or microsystems. The useful layer and the carrier substrate may vary in nature depending on the target component type and target application. Since silicon is currently the most commonly used semiconductor material, the useful layer and the carrier substrate may be made of, in particular, monocrystalline silicon, but are not limited, of course, to this material.

The transfer process according to the present disclosure first comprises a step a) of providing a donor substrate 1, from which the useful layer 3 will be taken. The donor substrate 1 includes a buried weakened plane 2 (FIG. 2-a)). The latter is advantageously formed by ion-implanting light species into the donor substrate 1 at a defined depth. The light species are chosen, preferably, from hydrogen and helium, or a combination of hydrogen and helium, since these species promote the formation of microcavities around the defined implantation depth, resulting in the buried weakened plane 2.

The useful layer 3 is delimited by a front face 1a of the donor substrate 1 and the buried weakened plane 2.

The donor substrate 1 may be formed of at least one material chosen from silicon, germanium, silicon carbide, IV-IV, III-V or II-VI semiconductor compounds and piezoelectric materials (for example, $LiNbO_3$, $LiTaO_3$, etc.). It may further include one or more surface layers arranged on the front face 1a and/or on the back face 1b thereof, which may be of any nature, for example, dielectric.

The transfer process also comprises a step b) of providing a carrier substrate 4 (FIG. 2-b)).

The carrier substrate may be formed, for example, of at least one material chosen from the silicon, silicon carbide, glass, sapphire, aluminum nitride or any other material that might be available in substrate form. It may also include one or more surface layers of any nature, for example, dielectric.

As mentioned above, one advantageous application of the transfer process according to the present disclosure is the production of SOI substrates. In this particular case, the donor substrate 1 and the carrier substrate 4 are made of monocrystalline silicon, and either or both of the substrates include a surface layer of silicon oxide 6 on the front face thereof.

The transfer process next comprises a step c) of joining the donor substrate 1, by its front face 1a, to the carrier substrate 4 along a bonding interface 7 so as to form a bonded structure 5 (FIG. 2-c)).

The attachment operation may be carried out using any known method, in particular, by direct bonding by molecular adhesion, by thermocompression or by electrostatic bonding. These well-known prior-art techniques will not be described in detail here. However, it is recalled that, prior to joining, the donor substrate 1 and the carrier substrate 4 will have undergone surface-activation and/or cleaning sequences in order to ensure the quality of the bonding interface 7 in terms of defects and bonding energy.

In the transfer process according to the present disclosure, a step d) of annealing the bonded structure 5 is then carried out in order to increase the level of weakening of the buried weakened plane 2. The range of temperatures over which the anneal may be carried out for this operation of weakening the buried plane 2 depends primarily on the type of bonded structure 5 (homostructure or heterostructure) and on the nature of the donor substrate 1.

By way of example, in the case of a donor substrate 1 and a carrier substrate 4 made of silicon, the anneal in step d) reaches a maximum temperature that is typically between 200° C. and 600° C., advantageously between 300° C. and 500° C. and even more advantageously between 350° C. and 450° C.

The anneal may include a temperature ramp-up (typically between 200° C. and the maximum temperature) and a hold at the maximum temperature. In general, the duration of such an anneal will be between a few tens of minutes and several hours, depending on the maximum temperature of the anneal. The time/temperature pair determines the thermal budget applied to the bonded structure 5 during the anneal.

The level of weakening of the buried weakened plane 2 is defined by the area occupied by the microcavities present in the buried weakened layer 2. In the case of a donor substrate 1 made of silicon, this area occupied by the microcavities may be characterized by infrared microscopy.

The level of weakening may range from a low level (<1%, below the detection threshold of the characterizing instruments) up to more than 80%, depending on the thermal budget applied to the bonded structure 5 during the anneal. The weakening thermal budget is always kept below the splitting thermal budget for which spontaneous initiation of the splitting wave in the buried weakened plane 2 is obtained during the anneal.

It is recalled that, in the transfer process of the prior art mentioned in the introduction, the bonded structure 5 is removed after the annealing step, when the buried weakened plane 2 exhibits a certain level of weakening. An energy pulse is then applied to the buried weakened plane 2 in order to cause the splitting wave to initiate; the propagation of the splitting wave results in the useful layer 3 being transferred to the carrier substrate 4. As mentioned above, problems have been identified in the reproducibility of the morphological surface properties of useful layers 3 after transfer, even though the steps in the process are carried out under identical conditions.

This lack of reproducibility is due, in particular, to variability in the steps of implanting light species in order to form the buried weakened layer, and of annealing. This variability may stem from non-uniformity in implanted dose or in implantation energy, or from non-uniformity in temperature across a structure or across a plurality of structures. The variation in the level of weakening over the course of the anneal, for one and the same thermal budget, may thus differ for similar bonded structures annealed in batches or separately.

To overcome this problem, the transfer process according to the present disclosure envisages that, in annealing step d), a predetermined stress is applied to the buried weakened layer 2 for a period of time (FIG. 2-d)). What is understood by a "predetermined stress" is a stress of defined and constant amplitude. The predetermined stress may be applied, in particular, by applying a controlled mechanical load to the bonded structure 5, as will be described in greater detail below.

The predetermined stress is chosen so as to initiate a splitting wave exhibiting self-sustained propagation once a given level of weakening has been reached in the buried weakened plane 2. Self-sustained propagation means that once initiated, the spitting wave propagates by itself, without the application of additional stress, throughout the entire extent of the buried weakened plane 2, so that the useful layer 3 is completely detached from the donor substrate 1 and transferred to the carrier substrate 4.

The period of time for which the predetermined stress is applied to the buried weakened plane 2 is typically longer than one minute. In particular, it is between one minute and five hours. In other words, the period of time is a fraction of the duration of the anneal between 1% and 100%.

At the end of the period of time, the given level of weakening has been reached: the predetermined stress then causes the initiation and the self-sustained propagation of the splitting wave along the buried weakened plane 2, resulting in the useful layer 3 being transferred to the carrier substrate 4 (FIG. 2-e)). In the transfer process according to the present disclosure, the initiation of the splitting wave in the buried weakened plane 2 is not concurrent with the application of the predetermined stress to the plane 2. The splitting wave is initiated by the predetermined stress only once the buried weakened plane has reached the given level of weakening.

Applying a predetermined stress to the bonded structure 5 in annealing step d) in this way, for a period of time, allows the splitting wave to be initiated in the buried weakened plane 2 once a given, constant and reproducible, level of weakening has been reached. The splitting wave is therefore no longer initiated at constant thermal budget (as in the transfer process of the prior art mentioned above) but at constant level of weakening of the buried weakened plane 2. Even if there are variations in the implantation or annealing conditions between bonded structures 5 treated in one and the same batch or in different batches, the same predetermined stress applied to the buried weakened plane 2 of each bonded structure 5 will initiate the splitting wave for one and the same given level of weakening, at the end of a period of time specific to each bonded structure 5. This makes it possible to ensure a high level of reproducibility of the morphological surface properties of the useful layers 3, which are highly dependent on the level of weakening of the buried weakened plane 2 at the moment of initiation and propagation of the splitting wave.

According to a first variant, the predetermined stress is applied to the buried weakened plane 2 from the start of annealing step d):, the period of time (for which the predetermined stress is applied to the buried weakened plane 2) therefore runs from the start of (or potentially before) the anneal until the given level of weakening has been reached, when the splitting wave is initiated.

According to a second variant, the predetermined stress is applied after a predetermined anneal duration, without interrupting the anneal. This variant may promote the consolidation of the bonding interface 7 of the bonded structure 5 at the start of annealing, prior to the application of the predetermined stress to the buried weakened plane 2. In this case, the period of time runs from an intermediate time during the anneal until the given level of weakening has been reached, when the splitting wave is initiated.

According to the process according to the present disclosure, the predetermined stress is chosen according to the level of weakening that is desired for the propagation of the splitting wave. A large stress will allow the splitting wave to be initiated for a low level of weakening of the buried weakened plane 2; a smaller stress will allow the splitting wave to be initiated for a higher level of weakening of the buried weakened plane 2. The given level of weakening is defined by the area occupied by microcavities in the buried weakened plane 2 and may be chosen to be between 1% and 90%, preferably, between 5% and 40%. Relatively low levels of weakening, for example, lower than 25%, promote decreased surface roughness after transfer and a high degree of uniformity of thickness for the transferred useful layers 3.

Advantageously, the transfer process is applied to the batch treatment of a plurality of bonded structures 5, in which the predetermined stress is applied to the buried weakened plane 2 of each of the bonded structures 5 so as to initiate the splitting wave once the given level of weakening has been reached for each bonded structure 5. In this case, the anneal in step d) may be performed in a horizontally or vertically configured heat treatment apparatus, suitable for batch-treating a plurality of bonded structures 5.

Taking variations in the implantation or annealing conditions between bonded structures 5 into account, the period of time for which the predetermined stress is applied to the buried weakened plane 2 and at the end of which the splitting wave will be initiated could be longer or shorter for each of the bonded structures 5: specifically, the buried weakened planes 2 will not all reach the given level of weakening for which the applied predetermined stress will cause initiation at the same time. The duration of the anneal is defined so as to take these variations into account and to allow initiation and self-sustained propagation in the buried weakened plane 2 for all of the bonded structures 5. Each bonded structure 5 will then have undergone splitting of its buried weakened plane 2 for the given level of weakening, i.e., at a constant and reproducible level.

The transfer process according to the present disclosure allows the level of weakening at which the splitting wave will propagate to be chosen and ensures that the wave is initiated at a constant level of weakening for all of the bonded structures 5: this allows advantageous morphological surface properties (low degree of roughness, high degree of uniformity and wafer-to-wafer reproducibility) to be obtained for the transferred useful layers 3.

According to one advantageous embodiment, the predetermined stress is applied to the buried weakened plane 2 locally, by applying a point mechanical load to the bonded structure 5 by means of a wedge 10. The wedge 10 is positioned at the bonding interface 7 and exerts a pressing force against chamfered edges of the donor 1 and carrier 4 substrates of the bonded structure 5. This results in tensile strain being generated in the buried weakened plane 2. The amplitude of the pressing force is predetermined and constant. By way of example, the pressing force may be between 0.5 N and 50 N.

Exemplary Application:

The transfer process according to the present disclosure may be used for the production of SOI substrates, the useful layer 3 of which is very thin, in particular, between a few nanometers and 50 nm.

The example used is that of donor 1 and carrier 4 substrates and made of monocrystalline silicon, each taking the form of a 300 mm-diameter wafer. The donor substrate 1 is covered with a layer of silicon oxide with a thickness of 50 nm. The buried weakened plane 2 is formed in the donor substrate 1 by co-implanting hydrogen and helium ions under the following conditions:

H: implantation energy 38 keV, dose 1E16 $H/cm^2$; and
He: implantation energy 25 keV, dose 1E16 $He/cm^2$.

The buried weakened layer 2 is located at a depth of about 290 nm from the surface of the donor substrate 1. It delimits, with the oxide layer 6, a useful layer 3 of about 240 nm.

The donor substrate 1 is joined to the carrier substrate 4 by direct bonding by molecular adhesion, to form the bonded structure 5. Prior to joining, the donor substrate 1 and the carrier substrate 4 will have undergone known surface-activation and/or cleaning sequences in order to ensure the quality of the bonding interface 7 in terms of defects and bonding energy.

Figure 3:
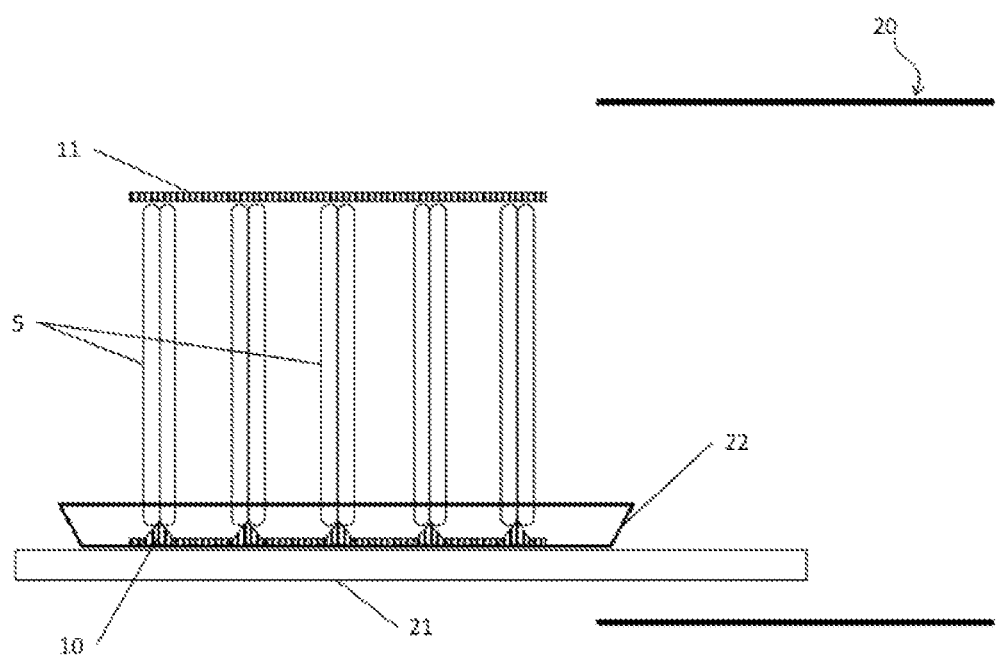
FIG. 3 shows an example of batch-treating a plurality of structures in a transfer process according to the present disclosure.

A horizontally configured oven 20 is used to perform the batch-annealing of a plurality of bonded structures 5 such as described above. This type of heat treatment apparatus 20 comprises a charge shovel 21 that bears cassettes 22 into which the bonded structures 5 are placed (FIG. 3). The charge shovel 21 moves between an entered position, in which the bonded structures 5 are inside the oven 20, and an exited position, in which they are outside the oven 20.

A system of wedges 10 is positioned on each cassette 22, beneath or on top of the bonded structures 5, so as to exert a constant point pressing force against the chamfered edges of the joined substrates of each bonded structure 5.

It should be noted that, in the case of the wedge 10 being located beneath the bonded structures 5, the weight of each bonded structure could constitute the pressing force. Alternatively, an additional device 11 may be provided in order to apply an additional pressing force locally at the edge of and on top of the bonded structures 5.

This mechanical load applied by the wedge system 10 (with or without the additional device 11) to the bonded structures 5 generates a predetermined local tensile strain in the buried weakened plane 2. The mechanical load may be applied from the start of the anneal or after a determined duration. This determined duration is always much shorter than the duration required to reach the given level of weakening for which the predetermined stress will result in the initiation of the splitting wave.

For an anneal for which the maximum temperature is 350° C., spontaneous splitting occurs after 200 minutes on average.

When a weight of 500 g (corresponding to a pressing force of about 5 N) is applied to each of the bonded structures 5 via the additional device 11, the initiation of the splitting wave occurs after 160 minutes on average, for a level of weakening of about 16%.

When a weight of 1500 g (corresponding to a pressing force of about 15 N) is applied to each of the bonded structures 5 via the additional device 11, the initiation of the splitting wave occurs after 110 minutes on average, for a level of weakening of about 12%.

Following the self-sustained propagation of the splitting wave in each of the bonded structures 5, what is obtained, after transfer, is the SOI substrate (transferred assembly 5a) and the remainder 5b of the donor substrate.

For the two examples mentioned above of initiating the splitting wave at constant maturity, morphological surface properties are obtained for the transferred useful layers 3, which are highly favorable (low degree of roughness, high degree of uniformity) and reproducible from one wafer to the next.

The finishing steps applied to the transferred assemblies 5a comprise chemical cleaning operations and at least one high-temperature smoothing heat treatment. Upon completion of these steps, the SOI substrates include a useful layer 3 with a thickness of 50 nm, the non-uniformity of which is below 2% and the surface roughness of which is below 0.3 nm RMS.

Of course, the present disclosure is not limited to the described implementations and examples, and variant embodiments may be introduced thereinto without departing from the scope of the invention as defined by the claims.

The invention claimed is:

1. A method for transferring a useful layer to a carrier substrate, comprising the following steps:
   a) providing a donor substrate including a buried weakened plane, the useful layer being delimited by a front face of the donor substrate and the buried weakened plane;
   b) providing a carrier substrate;
   c) joining the donor substrate, by its front face, to the carrier substrate along a bonding interface so as to form a bonded structure; and
   d) applying a predetermined stress to the buried weakened plane for a period of time and annealing the bonded structure during the period of time in order to increase a level of weakening of the buried weakened plane, the predetermined stress being chosen so as to initiate a splitting wave once a given level of weakening has been reached, at an end of the period of time, the given level of weakening having been reached, the predetermined stress causing initiation and self-sustained propagation of the splitting wave along the buried weakened plane, resulting in the useful layer being transferred to the carrier substrate;

wherein the given level of weakening is based on an area of the buried weakened plane that is occupied by microcavities.

2. The method of claim 1, wherein the period of time is between one minute and five hours.

3. The method of claim 1, wherein the period of time is a fraction of a duration of the anneal between 1% and 100%.

4. The method of claim 1, further comprising applying the method of claim 1 to a batch treatment of a plurality of bonded structures, wherein the predetermined stress is applied to the buried weakened plane of each of the bonded structures so as to initiate the splitting wave once the given level of weakening has been reached for each bonded structure.

5. The method of claim 4, wherein the anneal in step d) is performed in a horizontally or vertically configured heat treatment apparatus, the apparatus suitable for batch-treating a plurality of bonded structures.

6. The method of claim 1, wherein the predetermined stress is applied locally to the buried weakened plane of the bonded structure by a wedge that is positioned at the bonding interface and exerts a pressing force against the chamfered edges of the donor and carrier substrates of the bonded structure so as to generate a tensile strain in the buried weakened plane.

7. The method of claim 6, wherein the pressing force is between 0.5 N and 50 N.

8. The method of claim 1, wherein the area occupied by microcavities in the buried weakened plane is chosen to be between 1% and 90%.

9. The method of claim 1, wherein the anneal in step d) reaches a maximum temperature between 300° C. and 600° C.

10. The method of claim 1, wherein the predetermined stress is applied from the start of the anneal in step d).

11. The method of claim 1, wherein the donor substrate and the carrier substrate comprise monocrystalline silicon, and wherein the buried weakened plane is formed by ion implantation of light species into the donor substrate, the light species being chosen from among hydrogen and helium, or a combination of hydrogen and helium.

12. The method of claim 2, wherein the period of time is a fraction of a duration of the anneal between 1% and 100%.

13. The method of claim 12, further comprising applying the method of claim 12 to a batch treatment of a plurality of bonded structures, wherein the predetermined stress is applied to the buried weakened plane of each of the bonded structures so as to initiate the splitting wave once the given level of weakening has been reached for each bonded structure.

14. The method of claim 13, wherein the anneal in step d) is performed in a horizontally or vertically configured heat treatment apparatus, the apparatus suitable for batch-treating a plurality of bonded structures.

15. The method of claim 14, wherein the predetermined stress is applied locally to the buried weakened plane of the bonded structure by a wedge that is positioned at the bonding interface and exerts a pressing force against the chamfered edges of the donor and carrier substrates of the bonded structure so as to generate a tensile strain in the buried weakened plane.

16. The method of claim 15, wherein the pressing force is between 0.5 N and 50 N.

17. The method of claim 16, wherein the area occupied by microcavities in the buried weakened plane is chosen to be between 1% and 90%.

18. The method of claim 17, wherein the anneal in step d) reaches a maximum temperature between 300° C. and 600° C.

19. The method of claim 18, wherein the predetermined stress is applied from the start of the anneal in step d).

20. The method of claim 19, wherein the donor substrate and the carrier substrate comprise monocrystalline silicon, and wherein the buried weakened plane is formed by ion implantation of light species into the donor substrate, the light species being chosen from among hydrogen and helium, or a combination of hydrogen and helium.

* * * * *